(12) United States Patent
Lai

(10) Patent No.: US 9,356,040 B2
(45) Date of Patent: May 31, 2016

(54) JUNCTION FORMATION FOR VERTICAL GATE 3D NAND MEMORY

(71) Applicant: Macronix International Co., Ltd., Hsinchu (TW)

(72) Inventor: Sheng-Chih Lai, Zhubei (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 14/554,759

(22) Filed: Nov. 26, 2014

(65) Prior Publication Data

US 2015/0380430 A1     Dec. 31, 2015

Related U.S. Application Data

(60) Provisional application No. 62/017,852, filed on Jun. 27, 2014.

(51) Int. Cl.
| | |
|---|---|
| *H01L 29/76* | (2006.01) |
| *H01L 21/336* | (2006.01) |
| *H01L 27/115* | (2006.01) |
| *H01L 21/306* | (2006.01) |
| *H01L 21/265* | (2006.01) |
| *H01L 21/02* | (2006.01) |

(52) U.S. Cl.
CPC .... *H01L 27/11582* (2013.01); *H01L 21/02532* (2013.01); *H01L 21/26513* (2013.01); *H01L 21/30604* (2013.01); *H01L 27/11556* (2013.01)

(58) Field of Classification Search
CPC .............................. H01L 27/115; H01L 27/00
USPC ......................................... 257/314; 438/268
See application file for complete search history.

(56) References Cited

U.S. PATENT DOCUMENTS

| | | | |
|---|---|---|---|
| 5,218,471 A | 6/1993 | Swanson et al. | |
| 6,323,117 B1 | 11/2001 | Noguchi | |
| 7,018,783 B2 | 3/2006 | Iwasaki et al. | |
| 7,855,457 B2 | 12/2010 | Mizukami et al. | |
| 8,383,512 B2 | 2/2013 | Chen et al. | |
| 8,736,069 B2 | 5/2014 | Chiu et al. | |
| 2002/0106823 A1 | 8/2002 | Hwang et al. | |
| 2003/0064295 A1 | 4/2003 | Yasuyuki et al. | |
| 2003/0073271 A1* | 4/2003 | Birner et al. | 438/197 |
| 2004/0023499 A1 | 2/2004 | Hellig et al. | |
| 2007/0140001 A1 | 6/2007 | Motoi et al. | |
| 2009/0310415 A1 | 12/2009 | Jin et al. | |

(Continued)

*Primary Examiner* — Fernando L Toledo
*Assistant Examiner* — Neil Prasad
(74) *Attorney, Agent, or Firm* — Yiding Wu; Haynes Beffel & Wolfeld LLP

(57) ABSTRACT

A method is provided for manufacturing a memory device. A plurality of layers of a first semiconductor material is formed, and a plurality of holes is formed through the layers. An etch process is applied to the layers through the holes, to form pull-back regions in the layers adjacent and surrounding the holes. A film of second semiconductor material is deposited over the holes and into the pull-back regions. Portions of the film are removed from the holes while leaving elements of the second semiconductor material in the pull-back regions in contact with the first semiconductor material. The holes are filled with insulating material. Layers in the plurality of layers have respective first doping concentration profiles, and the elements of the second semiconductor material in the pull-back regions have second doping concentration profiles. The second doping concentration profiles establish a higher conductivity in the elements of second semiconductor material.

18 Claims, 12 Drawing Sheets

(56) References Cited

U.S. PATENT DOCUMENTS

| | | |
|---|---|---|
| 2010/0007001 A1 | 1/2010 | Wang et al. |
| 2010/0109164 A1* | 5/2010 | Kang et al. .................... 257/774 |
| 2011/0031630 A1 | 2/2011 | Hashimoto |
| 2011/0057321 A1 | 3/2011 | Wang et al. |
| 2012/0049268 A1* | 3/2012 | Chang et al. .................. 257/324 |
| 2012/0068241 A1 | 3/2012 | Sakuma et al. |
| 2013/0082341 A1 | 4/2013 | Shimizu et al. |
| 2013/0277852 A1* | 10/2013 | Chen ............................. 257/774 |
| 2013/0341797 A1 | 12/2013 | Lim |
| 2014/0264934 A1 | 9/2014 | Chen |

* cited by examiner

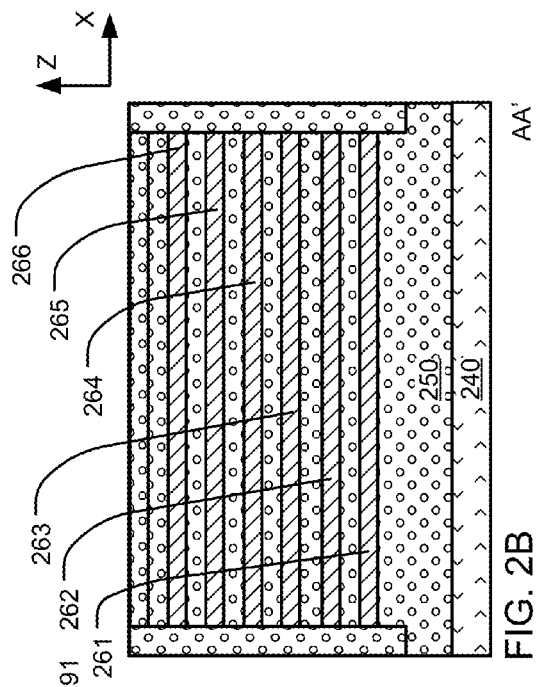
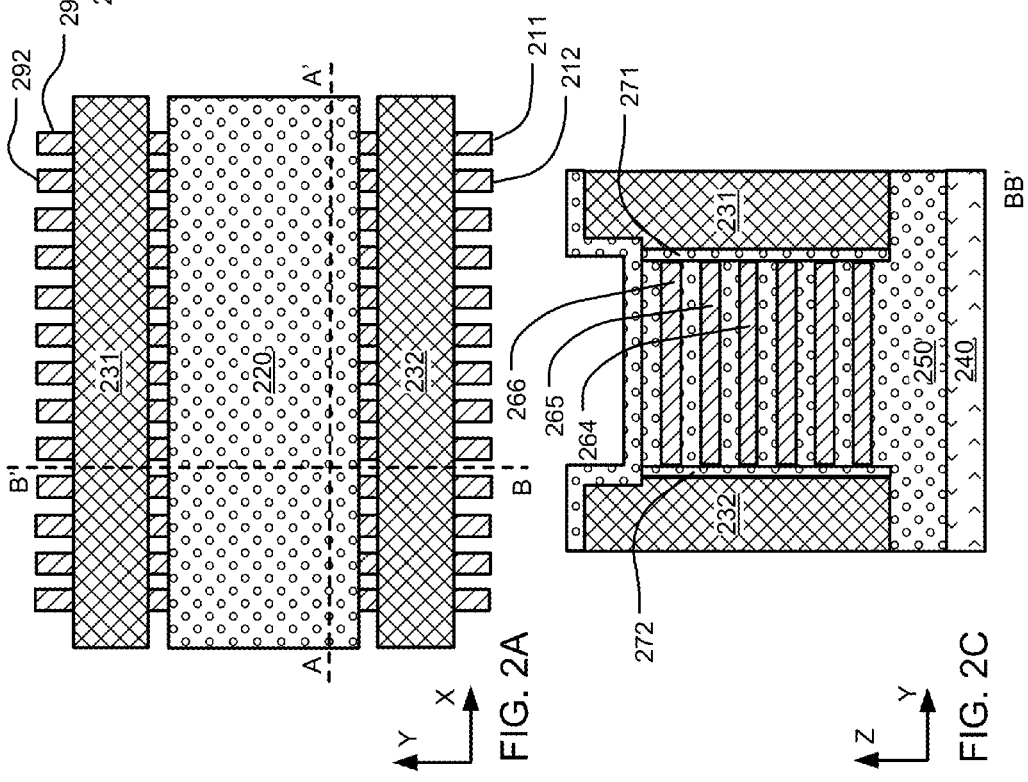
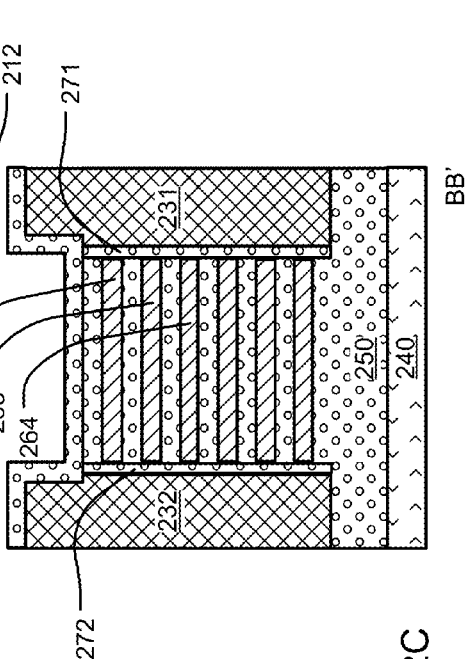

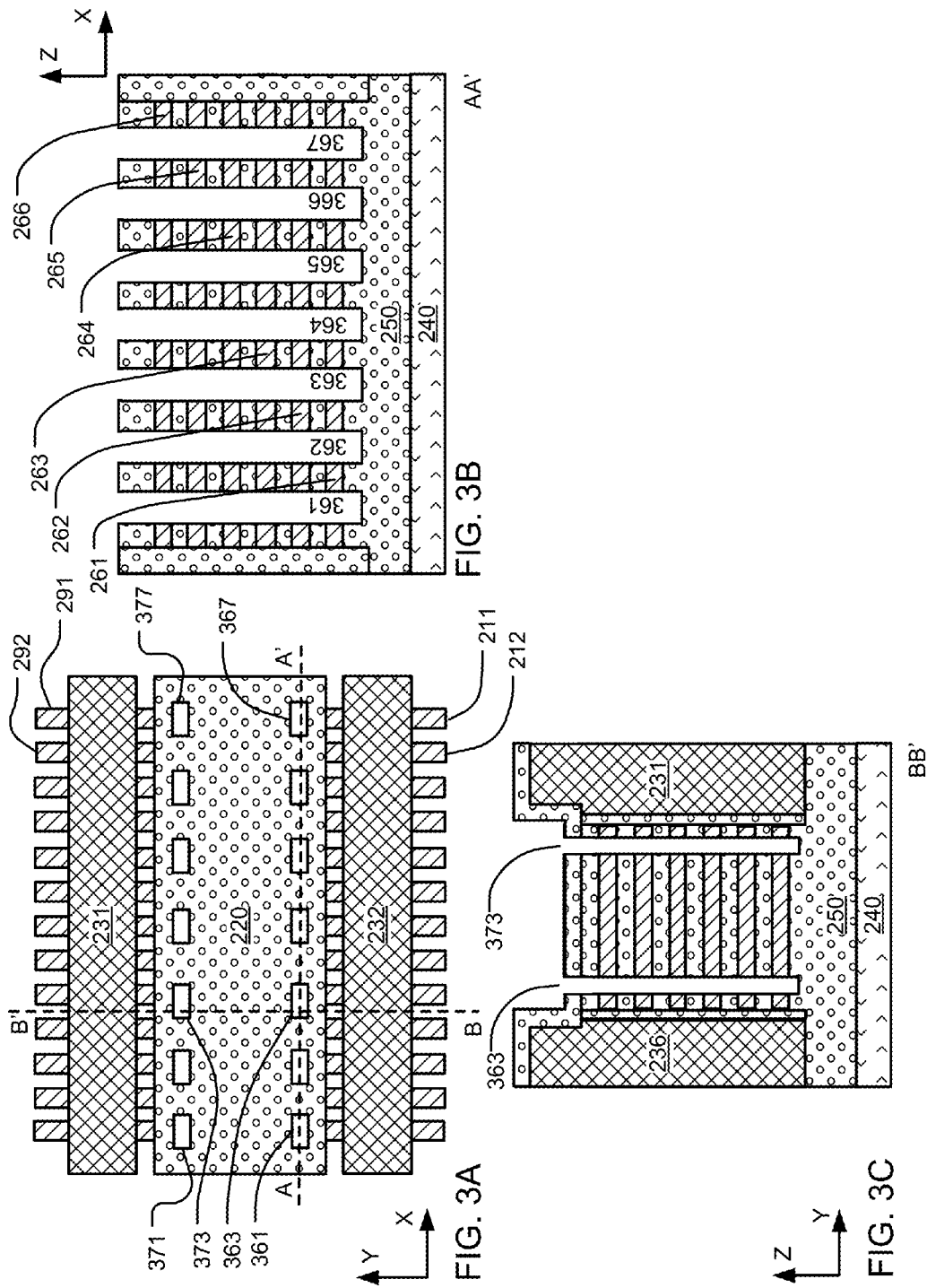

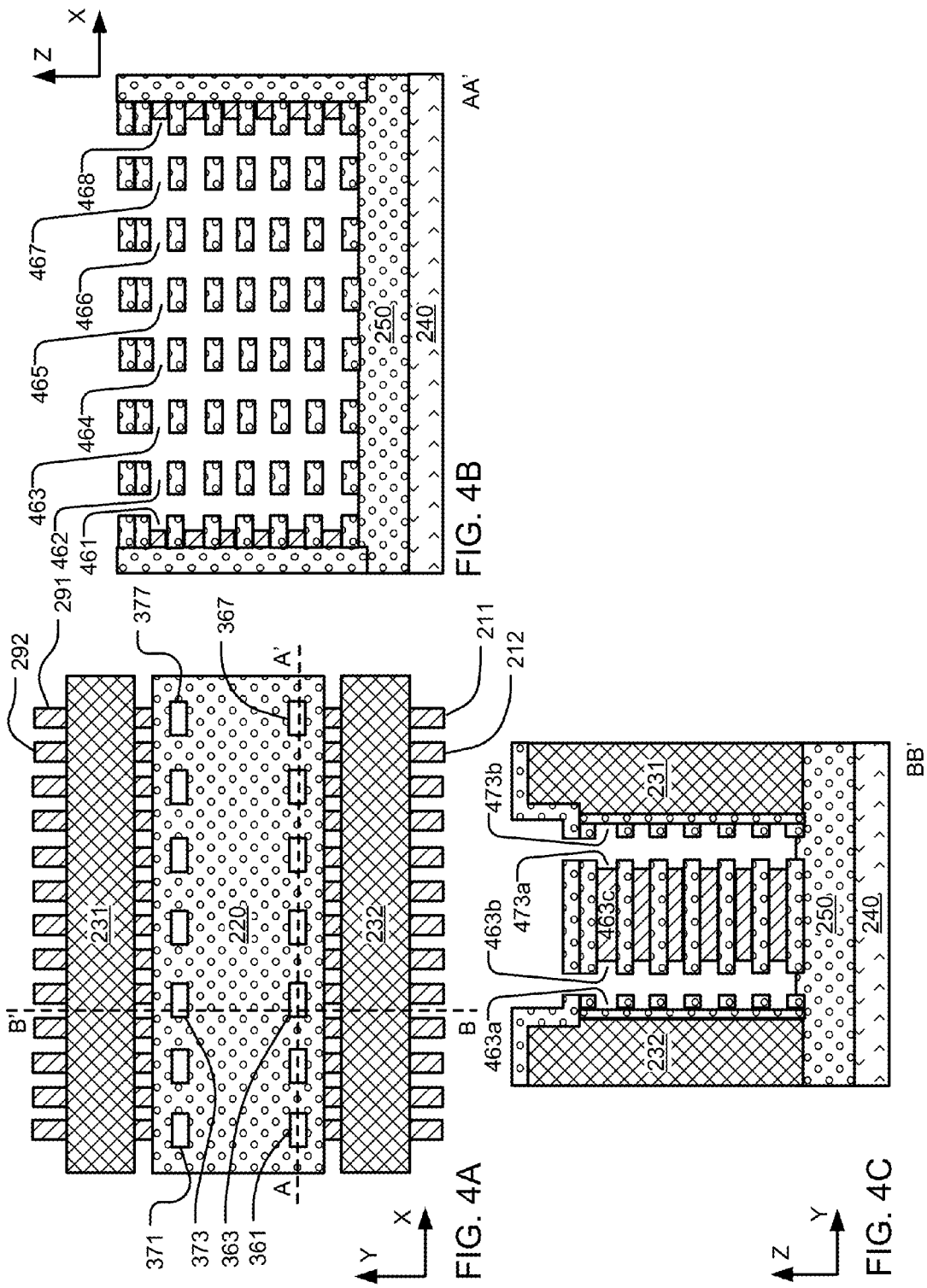

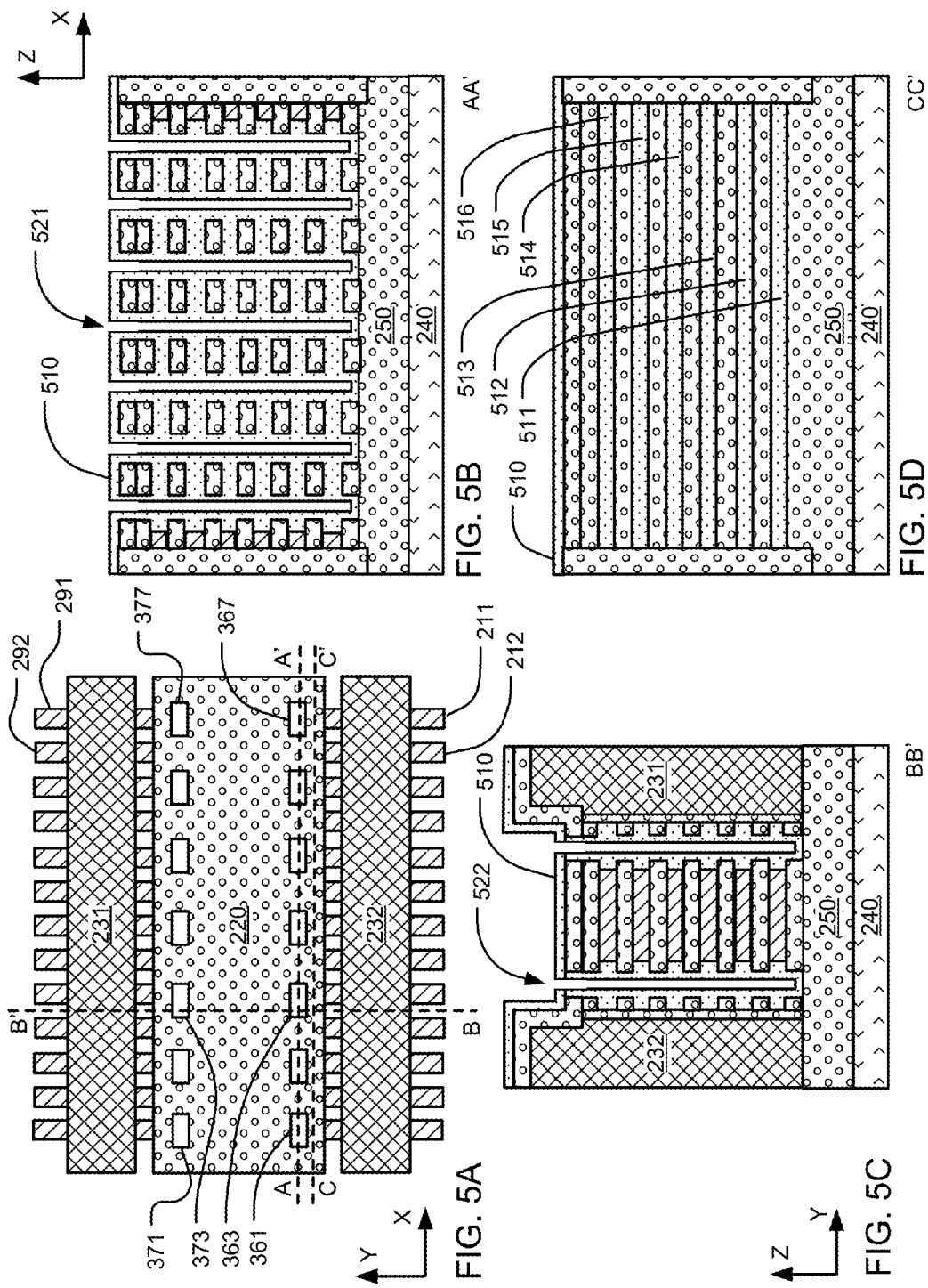

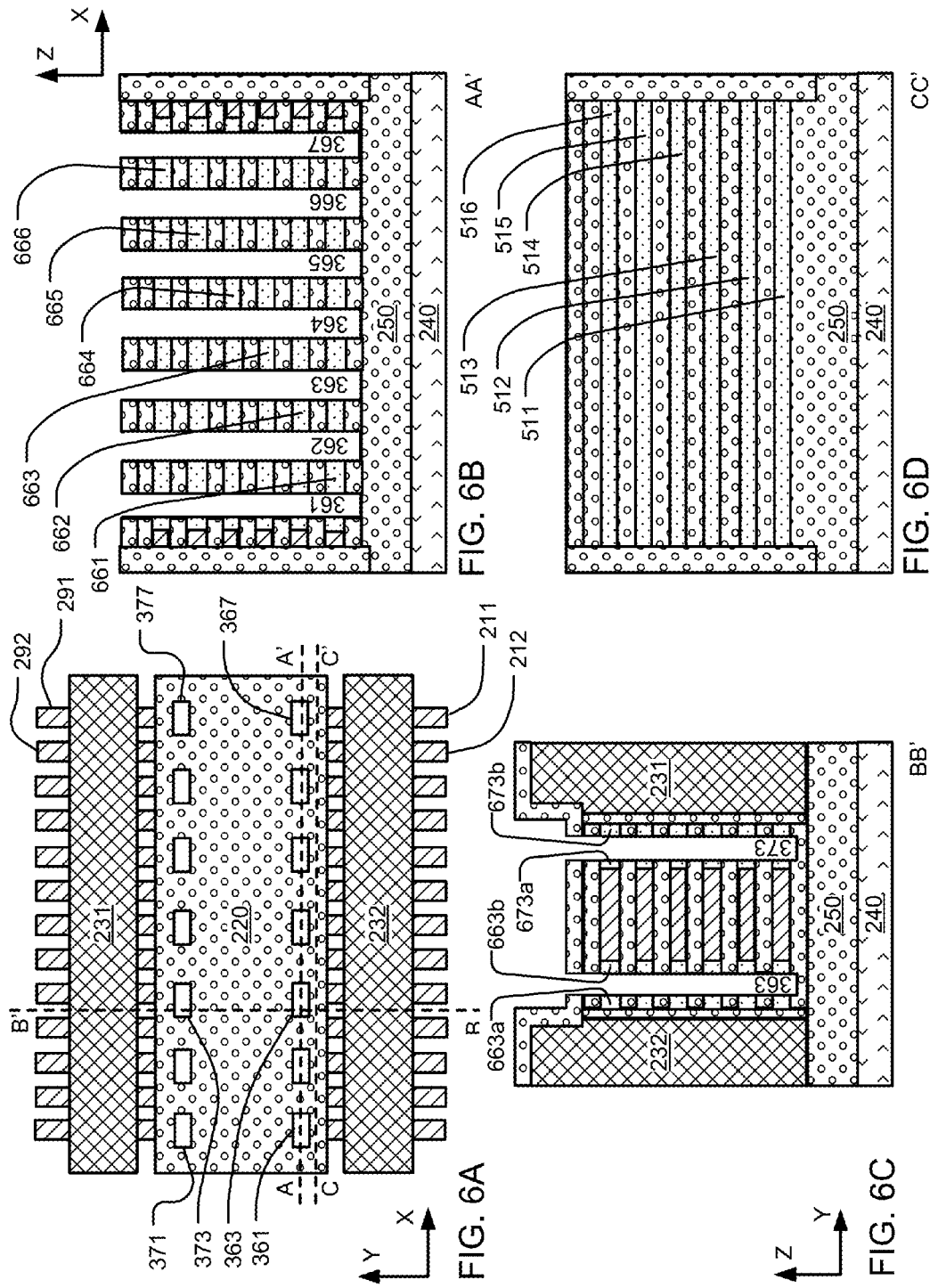

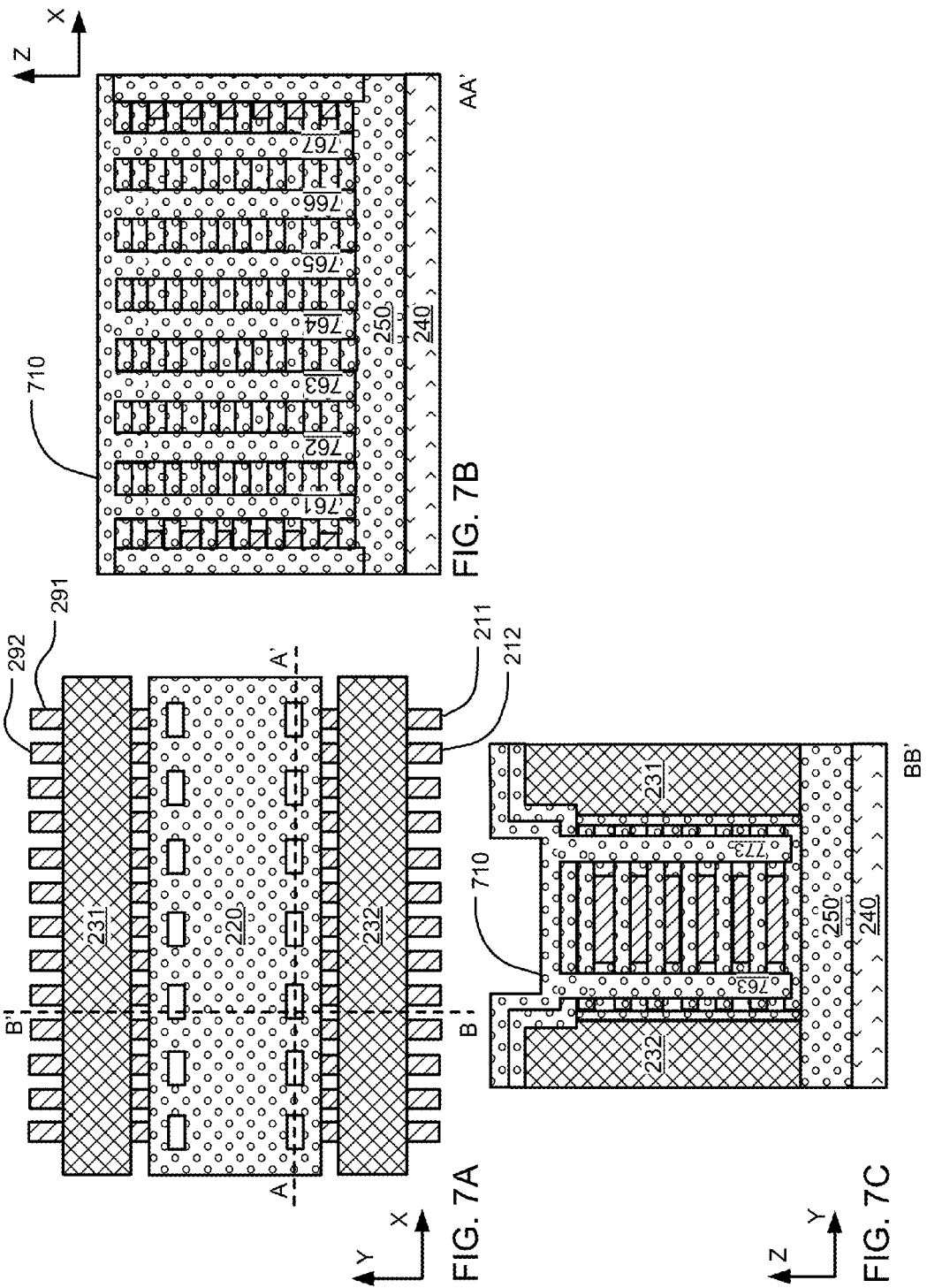

JUNCTION FORMATION FOR VERTICAL GATE 3D NAND MEMORY

PRIORITY APPLICATION

This application claims priority to U.S. Provisional Application No. 62/017,852, filed 27 Jun. 2014 entitled A Junction Formation Method for Vertical Gate 3D NAND Memory. This application is incorporated herein by reference.

BACKGROUND

1. Field of the Technology

The present technology relates to three-dimensional (3D) memory devices, and more particularly to methods to fabricate such memory devices.

2. Description of Related Art

Three dimensional (3D) semiconductor devices are characterized by multiple layers forming a stack of alternating active layers and insulating layers. In a memory device, each of the layers can include a planar array of memory cells. For certain three-dimensionally stacked memory devices, active layers can comprise active strips of materials configured as bit lines or word lines for memory cells stacked in spaced-apart ridge-like structures. The active layers can be made from a conductor, an undoped semiconductor, or a doped (p-type or n-type) semiconductor. In such 3D memory, memory cells can be disposed at the cross-points of the stacked bit lines or word lines and the crossing word lines or bit lines, forming a 3D memory array. A stack of bit line pads connects respective strips in the plurality of stacks of strips for selection of planes of memory cells.

One method for manufacturing a 3D memory device includes forming a stack of alternating active layers and insulating layers, etching the layers to define stacks of active strips connected to a stack of pads configured for making interlayer contacts to the layers, forming a memory layer over the stacks, forming memory cell gates or channels over the memory layer, and forming isolation material between the stacks. In such a method, a layer-by-layer implantation can be used to form different doping concentration profiles in various regions of the active layers, including the strips and the pads after each layer of semiconductor material is deposited. However, high thermal processes used in the method can affect high concentration junctions (e.g. >$10^{18}$ cm$^{-3}$) such as in the pads and consequently degrade the device performance. Furthermore, the cost of manufacturing using the method increases with the number of layers in the stacks because each layer of semiconductor material needs an individual implantation step for its own junction formation.

It is desirable to provide a method for improving fabrication of high concentration junctions, such as in bit line pads, in vertical gate 3D NAND flash memories.

SUMMARY

A method is provided for manufacturing a memory device. A plurality of layers of a first semiconductor material is formed, and a plurality of holes is formed through the layers. An etch process is applied to the layers through the holes, to form pull-back regions in the layers adjacent and surrounding the holes. A film of a second semiconductor material is deposited over the holes and into the pull-back regions. Portions of the film of the second semiconductor material are removed from the holes while leaving elements of the second semiconductor material in the pull-back regions in contact with the first semiconductor material in the layers. The holes are filled with insulating material.

Layers in the plurality of layers of first semiconductor material can have respective first doping concentration profiles, and the elements of the second semiconductor material in the pull-back regions can have second doping concentration profiles. The second doping concentration profiles can establish a higher conductivity in the elements of the second semiconductor material. The first and second semiconductor materials can be silicon with different doping concentration profiles.

The plurality of holes can include at least a set of holes arranged in a line, and the elements of the second semiconductor material in the pull-back regions adjacent holes in the set of holes can connect between adjacent holes in the line to form a conductive line. Openings can be formed for a plurality of stairstep landing areas on the plurality of layers, and ion implantation can be performed through the openings in the plurality of layers.

The layers of first semiconductor material can be patterned, and include pad regions and respective pluralities of strips of first semiconductor material coupled to the pad regions. The plurality of holes can be formed through the pad regions. The plurality of holes can include at least a set of holes arranged in a line, and the elements of the second semiconductor material in the pull-back regions adjacent holes in the set of holes can connect between adjacent holes in the line to form a conductive line of second semiconductor material. Openings can be formed for a plurality of stairstep landing areas in the pad regions on the plurality of layers, and ion implantation can be performed in the stairstep landing areas in the pad regions adjacent the openings.

In a layer in the plurality of layers, the pad region of first semiconductor material can have a first doping concentration profile, the conductive line of second semiconductor material in the pad region can have a second doping concentration profile, and the stairstep landing area can have a third doping concentration profile.

A memory device manufactured using the method substantially as described herein is also provided.

Other aspects and advantages of the present technology can be seen on review of the drawings, the detailed description and the claims, which follow.

BRIEF DESCRIPTION OF THE DRAWINGS

FIGS. 2A/2B/2C through 7A/7B/7C illustrate stages in a basic process flow for manufacturing a memory device like that of FIG. 1.

DETAILED DESCRIPTION

Figure 1:
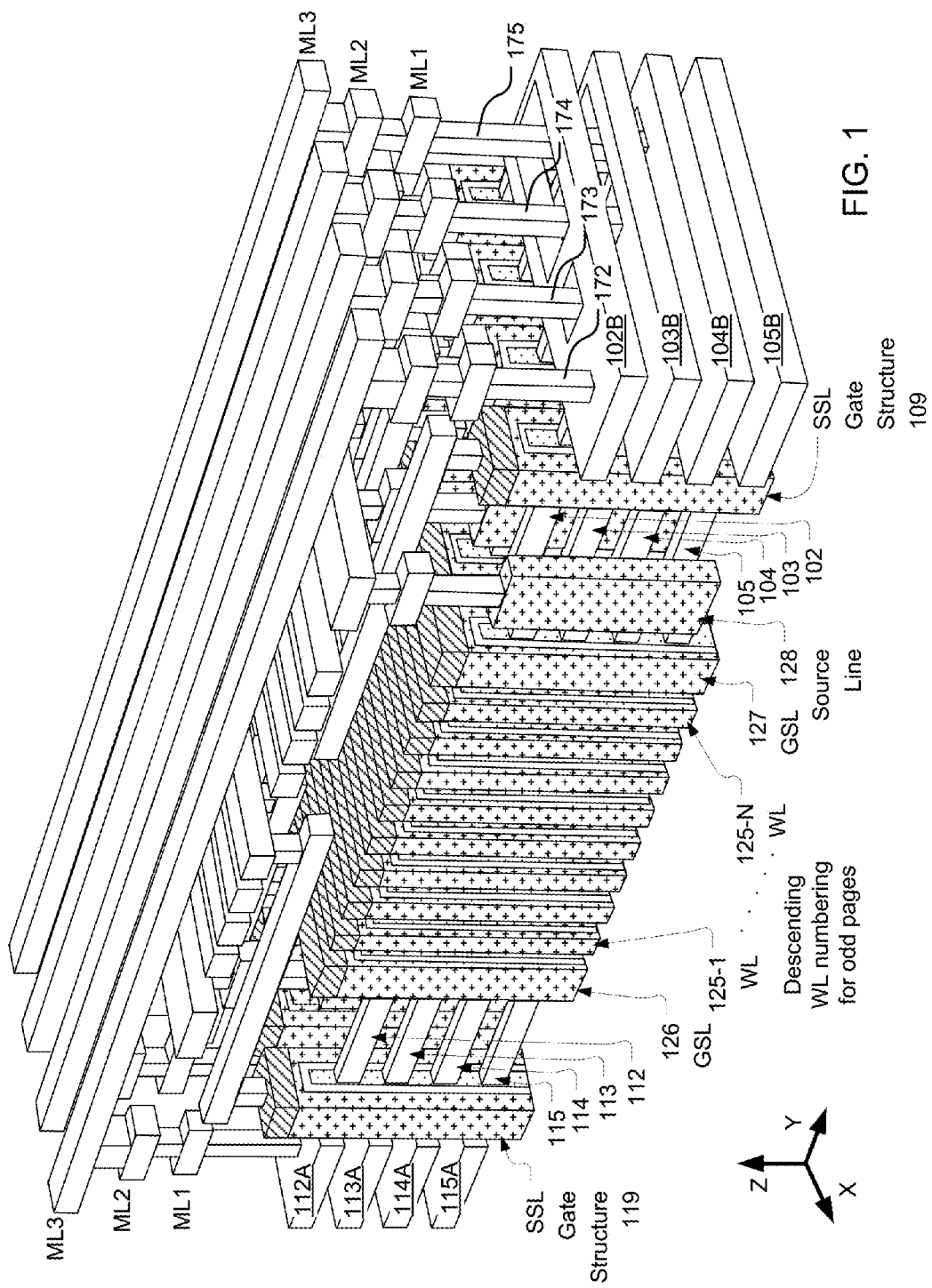
FIG. 1 is a perspective illustration of a three-dimensional (3D) NAND-flash memory device.

A detailed description of embodiments of the present technology is provided with reference to the Figures. It is to be understood that there is no intention to limit the technology to the specifically disclosed structural embodiments and methods but that the technology may be practiced using other features, elements, methods and embodiments. Preferred embodiments are described to illustrate the present technology, not to limit its scope, which is defined by the claims. Those of ordinary skill in the art will recognize a variety of equivalent variations on the description that follows. Like elements in various embodiments are commonly referred to with like reference numerals.

FIG. 1 is a perspective illustration of a three-dimensional (3D) NAND-flash memory device (Prior Art). The device illustrated in FIG. 1 includes stacks of conductive strips separated by insulating material. Insulating material is removed from the drawing to expose additional structure. For example, insulating material is removed between the conductive strips in the stacks, and is removed between the stacks of conductive strips. This structure is described herein in some detail, as an example of a three-dimensional (3D) memory array which can be manufactured on a semiconductor substrate, in combination with peripheral circuits on the substrate (not shown). Other multilayer circuit structures can also be formed using the technology described herein.

In the example shown in FIG. 1, a multilayer array is formed on an insulating layer, and includes a plurality of word lines 125-1 WL through 125-N WL conformal with the plurality of stacks. The plurality of stacks includes conductive strips 112, 113, 114, and 115 in multiple planes. Conductive strips in the same plane are electrically coupled together by linking elements (e.g. 102B).

Linking elements 112A, 113A, 114A, and 115A terminate conductive strips, such as the conductive strips 112, 113, 114, and 115 in the plurality of stack. As illustrated, these linking elements 112A, 113A, 114A, and 115A are electrically connected to different bit lines for connection to decoding circuitry to select planes within the array. These linking elements 112A, 113A, 114A, and 115A can be patterned at the same time that the plurality of stacks is defined.

Linking elements 102B, 103B, 104B, and 105B terminate conductive strips, such as conductive strips 102, 103, 104, and 105. As illustrated, interlayer connectors 172, 173, 174, 175 electrically connect linking elements 102B, 103B, 104B, and 105B to different bit lines in metal layers, such as a metal layer ML3, for connection to decoding circuitry to select planes within the array. These linking elements 102B, 103B, 104B, and 105B can be patterned at the same time that the plurality of stacks is defined.

Any given stack of conductive strips is coupled to either the linking elements 112A, 113A, 114A, and 115A, or the linking elements 102B, 103B, 104B, and 105B, but not both. A stack of semiconductor bit lines has one of the two opposite orientations of bit line end-to-source line end orientation, or source line end-to-bit line end orientation. For example, the stack of conductive strips 112, 113, 114, and 115 has bit line end-to-source line end orientation; and the stack of conductive strips 102, 103, 104, and 105 has source line end-to-bit line end orientation.

The stack of conductive strips 112, 113, 114, and 115 is terminated at one end by the linking elements 112A, 113A, 114A, and 115A, passes through SSL gate structure 119, ground select line GSL 126, word lines 125-1 WL through 125-N WL, ground select line GSL 127, and is terminated at the other end by source line 128. The stack of conductive strips 112, 113, 114, and 115 does not reach the linking elements 102B, 103B, 104B, and 105B.

The stack of conductive strips 102, 103, 104, and 105 is terminated at one end by the linking elements 102B, 103B, 104B, and 105B, passes through SSL gate structure 109, ground select line GSL 127, word lines 125-N WL through 125-1 WL, ground select line GSL 126, and is terminated at the other end by a source line (obscured by other parts of the figure). The stack of conductive strips 102, 103, 104, and 105 does not reach the linking elements 112A, 113A, 114A, and 115A.

A layer of memory material is disposed in interface regions at cross-points between surfaces of the conductive strips 112-115 and 102-105 and the plurality of word lines 125-1 WL through 125-N WL. Ground select lines GSL 126 and GSL 127 are conformal with the plurality of stacks, similar to the word lines.

Every stack of conductive strips is terminated at one end by linking elements and at the other end by a source line. For example, the stack of conductive strips 112, 113, 114, and 115 is terminated at one end by linking elements 112A, 113A, 114A, and 115A, and terminated on the other end by a source line 128. At the near end of the figure, every other stack of conductive strips is terminated by the linking elements 102B, 103B, 104B, and 105B, and every other stack of conductive strips is terminated by a separate source line. At the far end of the figure, every other stack of conductive strips is terminated by the linking elements 112A, 113A, 114A, and 115A, and every other stack of conductive strips is terminated by a separate source line.

Bit lines and string select lines are formed at the metals layers ML1, ML2, and ML3. Bit lines are coupled to a plane decoder (not shown). String select lines are coupled to a string select line decoder (not shown).

The ground select lines GSL 126 and 127 can be patterned during the same step that the word lines 125-1 WL through 125-N WL are defined. Ground select devices are formed at cross-points between surfaces of the plurality of stacks and ground select lines GSL 126 and 127. The SSL gate structures 119 and 109 can be patterned during the same step in which the word lines 125-1 WL through 125-N WL are defined. String select devices are formed at cross-points between surfaces of the plurality of stacks and string select (SSL) gate structures 119 and 109. These devices are coupled to decoding circuitry for selecting the strings within particular stacks in the array.

In the example shown in FIG. 1, memory elements are formed in interface regions at cross-points between surfaces of the conductive strips 112-115 and 102-105 and the plurality of word lines 125-1 WL through 125-N WL. In operation, when voltage is applied to a gate structure of a memory element via one of the word lines, a channel region in a memory cell corresponding to the memory element beneath the gate structure is turned on.

Three-dimensional (3D) memory devices include vertical gate 3-D arrays and vertical channel 3-D arrays. The example of FIG. 1 describes a vertical gate 3-D array. An example of a vertical channel 3-D array is described in U.S. Non-Provisional patent application Ser. No. 14/284,306 filed on May 21, 2014, which is incorporated by reference as if fully set forth herein.

FIGS. 2A/2B/2C through 7A/7B/7C illustrate stages in a basic process flow for manufacturing a memory device like that of FIG. 1. The basic process flow forms a plurality of layers of a first semiconductor material alternating with insulating material. FIG. 2A is a top view of a memory device at a stage in the basic process flow. As shown in the example of FIG. 2A, the layers of first semiconductor material can be patterned to form a plurality of stacks of strips of first semiconductor material, and pad regions (e.g. 220) at each layer in the plurality of layers, where respective pluralities of strips are coupled to the pad regions on the plurality of layers. The plurality of stacks of strips of first semiconductor material can include a first plurality of stacks of strips (e.g. 211, 212) in contact with one edge of the pad regions 200, and a second plurality of stacks of strips of first semiconductor material (e.g. 291, 292) in contact with an opposite edge of the pad regions 200. A plurality of conductive lines (e.g. 231, 232) can be arranged orthogonally over the plurality of stacks of strips. The conductive lines can act as word lines for forming memory cells on the stacks of strips, and ground select lines and string select lines for operating memory cells.

In one implementation, at this stage in the basic process flow, most of high thermal processes have been performed including: forming a plurality of stacks of strips of the first semiconductor material, forming a memory layer on surfaces of the strips in the plurality of stacks of strips, forming a plurality of conductive lines over the memory layer, where the conductive lines can be used for word lines, ground select lines, and/or string select lines, and forming insulating material, such as STI (shallow trench insulation) oxide between the stacks of strips.

The memory layer can be formed by blanket deposition of a memory material that can include charge storage structures. Charge storage structures in the memory device can include multilayer dielectric charge trapping structures known from flash memory technologies as ONO (oxide-nitride-oxide), ONONO (oxide-nitride-oxide-nitride-oxide), SONOS (silicon-oxide-nitride-oxide-silicon), BE-SONOS (bandgap engineered silicon-oxide-nitride-oxide-silicon), TANOS (tantalum nitride, aluminum oxide, silicon nitride, silicon oxide, silicon), and MA BE-SONOS (metal-high-k bandgap-engineered silicon-oxide-nitride-oxide-silicon).

The plurality of conductive lines can include high work function metal or polysilicon having n-type or p-type doping, and be used for conductive lines which act as word lines, ground select lines and string select lines. The work function of a metal refers to the minimum thermodynamic work (i.e. energy) needed to remove an electron from the metal. The work function is a property of the surface of the metal. For instance, high work function metals can include chemical elements TiN, TaN, Pt, W, etc.

FIG. 2B is a cross-sectional view of the memory device taken along a line AA' in the X direction in FIG. 2A. As shown in the example of FIG. 2B, a plurality of layers of first semiconductor material (e.g. 261-266) alternating with insulating material (e.g. 250) in the Z direction is formed on a semiconductor substrate (e.g. 240).

In one implementation, the layers of first semiconductor material can be formed using poly-silicon having a first doping concentration profile suitable for acting as NAND cell channel regions (e.g. undoped or lightly doped) in a blanket deposition in an array area of a memory device. The insulating material can be implemented for example using silicon dioxide, other silicon oxides, or silicon nitride. These layers can be formed in a variety of ways, including low pressure chemical vapor deposition LPCVD processes available in the art.

FIG. 2C is a cross-sectional view of the memory device taken along a line BB' in the Y direction in FIG. 2A. FIG. 2C shows a plurality of layers of first semiconductor material (e.g. 264-266) alternating with insulating material (e.g. 250) in the Z direction between a plurality of conductive lines (e.g. 231, 232) and formed on a semiconductor substrate (e.g. 240). The conductive lines (e.g. 231, 232) are insulated from the plurality of layers of first semiconductor material (e.g. 271, 272) in the pad regions (e.g. 220). The conductive lines can be used for word lines (e.g. 125-1 to 125-N, FIG. 1), ground select lines (126, 127, FIG. 1), and/or string select lines (109, 119, FIG. 1).

FIGS. 3A, 3B and 3C show results of forming a plurality of holes through a plurality of layers of first semiconductor material in a memory device. FIG. 3A is a top view of the memory device, where the plurality of holes includes a first set of holes arranged in a line (e.g. 361-367), on one edge of the pad regions 200 in contact with a plurality of stacks of strips (e.g. 211, 212) over which a plurality of conductive lines (e.g. 232) is arranged. The plurality of holes also includes a second set of holes arranged in a line (e.g. 371-377), on an opposite edge of the pad regions 200 in contact with the second plurality of stacks of strips (e.g. 291, 292) over which a second plurality of conductive lines (e.g. 231) is arranged. Although the holes are shown to have a rectangular shape, the holes can have other shapes such as square, circle, polygon, etc.

FIG. 3B is a cross-sectional view of the memory device taken along a line AA' in the X direction in FIG. 3A. As shown in the example of FIG. 3B, holes in the first set of holes (e.g. 361-367) are formed through the plurality of layers of first semiconductor material in the Z direction (e.g. 261-266). The holes expose the first semiconductor material adjacent and surrounding the holes in the plurality of layers of first semiconductor material for a subsequent etch process to form pull-back regions.

FIG. 3C is a cross-sectional view of the memory device taken along a line BB' in the Y direction in FIG. 3A. FIG. 3C shows that a hole in the first set of holes (e.g. 363) and a hole in the second set of holes (e.g. 373) are formed through the plurality of layers of first semiconductor material in the Z direction (e.g. 261-266, FIG. 2). The holes expose the first semiconductor material adjacent and surrounding the holes in the plurality of layers of first semiconductor material.

FIGS. 4A, 4B and 4C show results of applying an etch process to the plurality of layers through the plurality of holes, to form pull-back regions in the layers adjacent and surrounding holes. The etch process can be wet etching or dry etching that is isotropic etching, and has high silicon/oxide etching selectivity as needed to minimize oxide damage to the insulating material (e.g. 250). FIG. 4A is a top view of the memory device like FIG. 3A, while details of pull-back regions are shown in FIGS. 4B and 4C.

FIG. 4B is a cross-sectional view of the memory device taken along a line AA' in the X direction in FIG. 4A. As shown in the example of FIG. 4B, pull-back regions (e.g. 461-468) are formed in the layers adjacent and surrounding the first set of holes (e.g. 361-367, FIG. 3B). For instance, pull-back regions 461 and 462 are formed in the layers adjacent and surrounding the hole 361, pull-back regions 462 and 463 are formed in the layers adjacent and surrounding the hole 362, pull-back regions 463 and 464 are formed in the layers adjacent and surrounding the hole 363, . . . , and pull-back regions 467 and 468 are formed in the layers adjacent and surrounding the hole 367. Along the line AA' in the X direction, the first semiconductor material between two adjacent holes (e.g. 362, 363, FIG. 3B) is removed to form a pull-back region (e.g. 463).

FIG. 4C is a cross-sectional view of the memory device taken along a line BB' in the Y direction in FIG. 4A. FIG. 4C shows that pull-back regions are formed in the layers adjacent and surrounding the holes. For instance, pull-back regions 463a and 463b are formed in the layers adjacent and surrounding the hole 363 (FIG. 3C), and pull-back regions 473a and 473b are formed in the layers adjacent and surrounding the hole 373 (FIG. 3C). Along the line BB' in the Y direction, the first semiconductor material between adjacent holes (e.g. 363 and 373, FIG. 3C) may not be completely removed, such that elements of the first semiconductor material (e.g. 463c) may remain between adjacent pull-back regions (e.g. 463b and 473a) between the adjacent holes (e.g. 363 and 373, FIG. 3C).

FIGS. 5A, 5B, 5C and 5D show results of depositing a film of the second semiconductor material over the plurality of holes and into the pull-back regions. The second semiconductor material can be N-doped or P-doped semiconductor material, depending on the design of the memory device and array architecture. The film of the second semiconductor material can be deposited using a CVD (chemical vapor deposition) process or an ALD (atomic layer deposition) process. FIG. 5A is a top view of the memory device, where for clarity the deposited film is not shown, while details of the deposited film are shown in FIGS. 5B, 5C and 5D.

FIG. 5B is a cross-sectional view of the memory device taken along a line AA' in the X direction in FIG. 5A. As shown in the example of FIG. 5B, a film of the second semiconductor material (e.g. 510) is deposited over the first set of holes (e.g. 361-367, FIG. 3B) and into the pull-back regions (e.g. 461-468, FIG. 4B). In one implementation, holes, such as in the first set of holes (e.g. 361-367, FIG. 3B), are not fully filled (e.g. 521) to simplify a subsequent process to remove excess material in the film of the second semiconductor material.

FIG. 5C is a cross-sectional view of the memory device taken along a line BB' in the Y direction in FIG. 5A. FIG. 5C shows that the film of the second semiconductor material (e.g. 510) is deposited over the plurality of holes (e.g. 363, 373, FIG. 3C) and into the pull-back regions (e.g. 463a, 463b, 473a, 473b, FIG. 4C). In one implementation, the holes (e.g. 363, 373, FIG. 3C) are not fully filled (e.g. 522) to simplify a subsequent process to remove excess material in the film of the second semiconductor material.

FIG. 5D is a cross-sectional view of the memory device taken along a line CC' in the X direction in FIG. 5A. FIG. 5D shows that the film of the second semiconductor material (e.g. 510) is deposited into pull-back regions adjacent and surrounding the holes (e.g. 511-516), such that physical connection is made sufficient to support electrical current between the film of the second semiconductor material (e.g. 510) having a second doping concentration profile in the pull-back regions and strips in the plurality of stacks of strips (e.g. 211, 212) of the first semiconductor material having the first doping concentration profile.

The first semiconductor material can be undoped, or lightly doped with n-type or p-type doping. The second semiconductor material can be lightly or heavily doped with n-type or p-type doping. The first and second semiconductor materials have different doping concentration profiles, and can have the same type or different types of doping. In one implementation, depending on the materials chosen for the first and second semiconductor materials, PN junctions can be formed at boundary or interface between the second semiconductor material in the pull-back regions having the second doping concentration profile, and the first semiconductor material in the strips having the first doping concentration profile.

FIGS. 6A, 6B, 6C and 6D show results of removing portions of the film of the second semiconductor material from the plurality of holes while leaving elements of the second semiconductor material in the pull-back regions in contact with the first semiconductor material in the layers. The removal process can be performed by isotropic or anisotropic etching. The removal of portions of the film of the second semiconductor material from the plurality of holes, including on side surfaces of the holes, prevents layer-to-layer shorting.

FIG. 6A is a top view of the memory device like FIG. 5A, while details of the deposited film are shown in FIGS. 6B, 6C and 6D.

FIG. 6B is a cross-sectional view of the memory device taken along a line AA' in the X direction in FIG. 6A. As shown in the example of FIG. 6B, elements of the second semiconductor material (e.g. 661-666) remain in the pull-back regions, so that layers of first semiconductor material (e.g. 261-266, FIG. 3B) have been replaced with layers of second semiconductor material between the first set of holes (e.g. 361-367).

FIG. 6C is a cross-sectional view of the memory device taken along a line BB' in the Y direction in FIG. 6A. As shown in the example of FIG. 6C, elements of the second semiconductor material (e.g. 663a, 663b, 673a, 673b) remain in the pull-back regions (e.g. 463a, 463b, 473a, 473b, FIG. 4C).

FIG. 6D is a cross-sectional view of the memory device taken along a line CC' in the X direction in FIG. 6A. FIG. 6D shows the second semiconductor material (e.g. 510) deposited into pull-back regions adjacent and surrounding the holes (e.g. 511-516). FIGS. 6B, 6C and 6D also show that portions of the layer of the second semiconductor material (e.g. 510) deposited over the pad regions (e.g. 220), including along the lines AA', BB' and CC', are removed by the removal process.

The elements of the second semiconductor material in the pull-back regions, including those shown in FIGS. 6B, 6C and 6D, are in contact with the first semiconductor material in the layers. The elements of the second semiconductor material in the pull-back regions adjacent holes in the set of holes connect between adjacent holes to form a conductive line. The conductive line can act as a low resistance path in contact with the first semiconductor material in the layers of first semiconductor material.

Layers in the plurality of layers have respective first doping concentration profiles, and the elements of the second semiconductor material in the pull-back regions have second doping concentration profiles. The second doping concentration profiles establish a higher conductivity in the elements of the second semiconductor material. The first and second semiconductor materials can be silicon with different doping concentration profiles.

FIGS. 7A, 7B and 7C show results of filling the plurality of holes with insulating material to seal the holes. The insulating material can be an oxide material. FIG. 7A is a top view of the memory device, where for clarity the insulating material is not shown. FIG. 7B is a cross-sectional view of the memory device taken along a line AA' in the X direction in FIG. 7A, showing that the first set of holes (e.g. 361-367, FIG. 6B) is filled with insulating material (e.g. 710), so that pillars of insulating material (e.g. 761-767) are formed. FIG. 7C is a cross-sectional view of the memory device taken along a line BB' in the Y direction in FIG. 7A, showing that a hole in the first set of holes (e.g. 363) and a hole in the second set of holes (e.g. 373) are filled with the insulating material (e.g. 710), so that pillars of insulating material (e.g. 763, 773) are formed.

Figure 8:
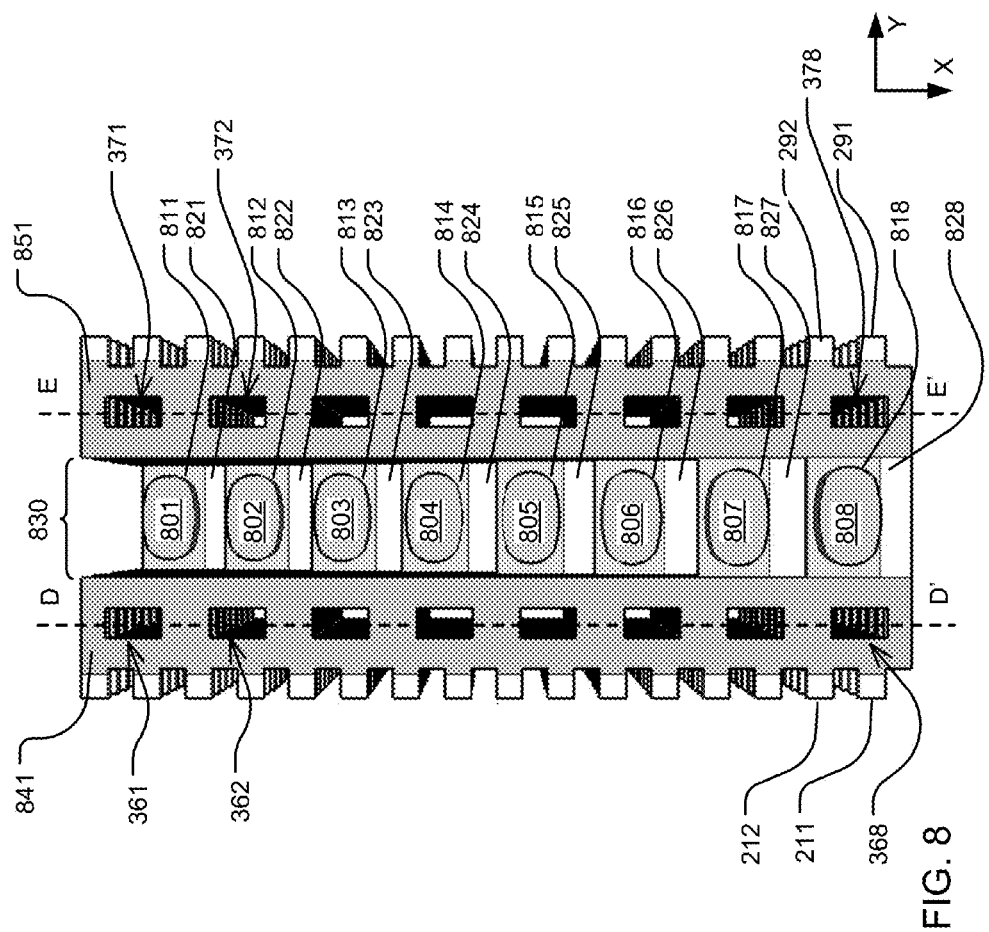
FIG. 8 is a top view of pad regions including a plurality of stairstep landing areas.

FIG. 8 is a top view of pad regions (e.g. 220, FIG. 7A) including a plurality of stairstep landing areas. The orientation of the pad regions shown in FIG. 8 is rotated 90 degrees from the pad regions 220 shown in FIG. 7A. In particular, FIG. 8 shows results of forming openings for a plurality of stairstep landing areas on semiconductor pads in the stack of semiconductor pads (e.g. 811-818), and performing ion implantation in the stairstep landing areas adjacent the respective openings. As a result of the ion implantation, ion implantation regions in the stairstep landing areas (e.g. 811-

818) in the semiconductor pads are formed adjacent the respective openings, and can have a third doping concentration profile.

The plurality of holes includes a first set of holes (e.g. 361, 362, 368) arranged in a line DD', on one edge of the pad regions 200 in contact with a plurality of stacks of strips (e.g. 211, 212). The plurality of holes also includes a second set of holes (e.g. 371, 372, 378) arranged in a line EE', on an opposite edge of the pad regions 200 in contact with a second plurality of stacks of strips (e.g. 291, 292).

Stairstep landing areas on respective semiconductor pads (e.g. 811-818) in the plurality of layers in the openings (e.g. 830) are disposed between conductive lines (e.g. 841, 851) adjacent and surrounding the first set of holes (e.g. 361, 362) and the second set of holes (e.g. 371, 372). A plurality of interlayer connectors (e.g. 801-808) is formed, extending from a connector surface to stairstep landing areas on respective semiconductor pads (e.g. 811-818) on the plurality of layers. Patterned conductor lines in a metal layer such as metal one (e.g. ML1, FIG. 1) can be formed on top of the connector surface and connected to respective interlayer connectors. The patterned conductor lines can include a plurality of global bit lines coupled to sensing circuits.

Strips in the plurality of stacks of strips of first semiconductor material (e.g. 211, 212, 291 and 292) can have respective as deposited first doping concentration profiles used for channels in memory cells. The conductive lines of second semiconductor material adjacent and surrounding the first set of holes and the second set of holes (e.g. 841, 851) have second doping concentration profiles. The stairstep landing areas on respective semiconductor pads (e.g. 811-818) can have third doping concentration profiles resulting from the ion implantation. Regions between the semiconductor pads (e.g. 821-828) can have the as deposited first semiconductor material with the first doping concentration profiles.

Figure 9:
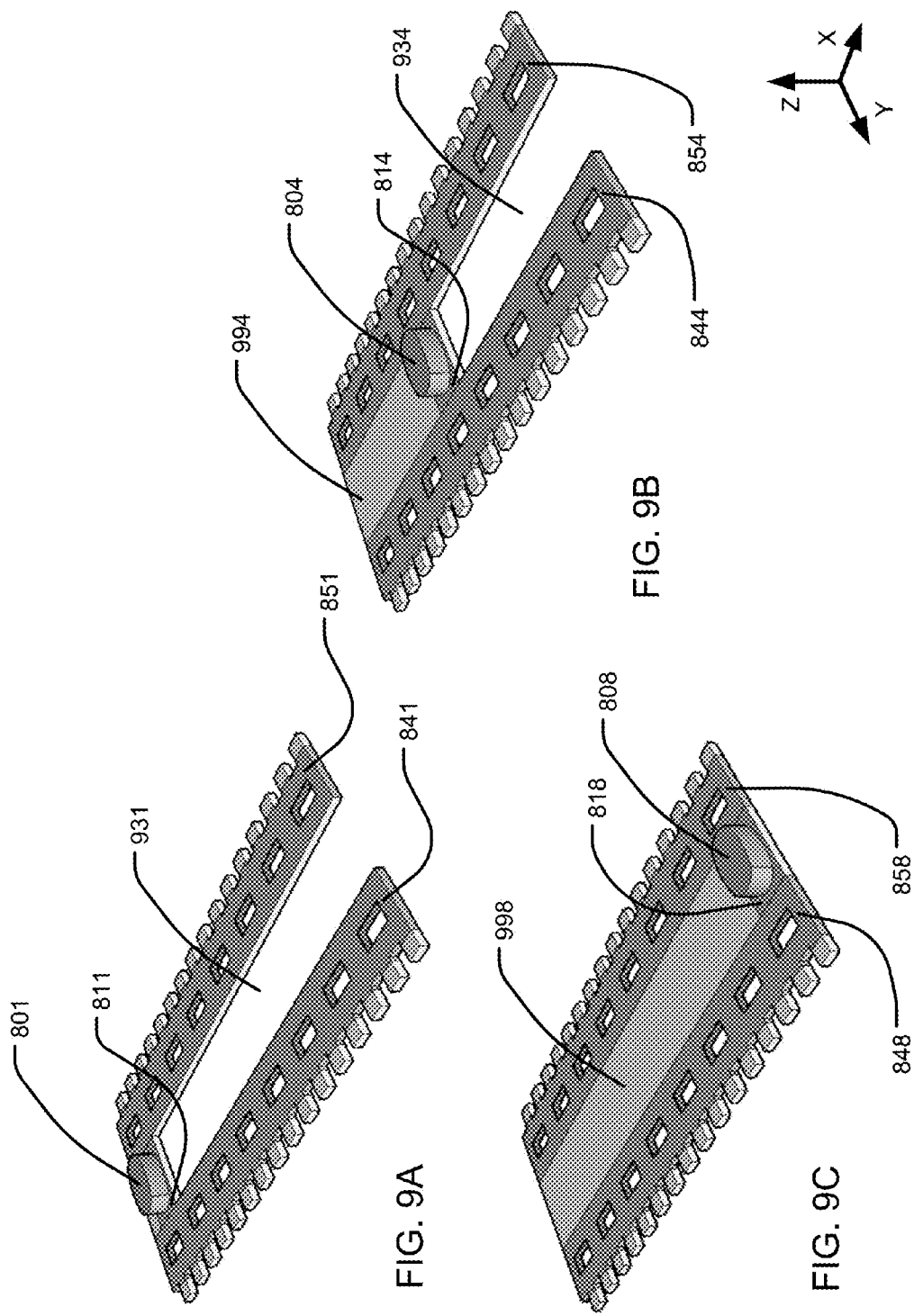
FIGS. 9A, 9B and 9C show perspective views of pad regions on various layers.

FIGS. 9A, 9B and 9C show perspective views of pad regions on various layers. FIG. 9A shows the pad region on the top layer. Conductive lines of second semiconductor material adjacent and surrounding the first set of holes and the second set of holes (e.g. 841, 851) have second doping concentration profiles. A stairstep landing area 811 has a third doping concentration profile resulting from the ion implantation. An interlayer connector (e.g. 801) is formed on the stairstep landing area 811. Stairstep landing areas on layers below the top layer (e.g. 812-818) are formed in an opening between conductive lines 841 and 851 on the layer (e.g. 931) and adjacent the stairstep landing area 811 on the top layer.

FIG. 9B shows the pad region at a layer between the top layer and the bottom layer. The first semiconductor material (e.g. 994) as deposited remains between conductive lines (e.g. 844, 854), and may have the same doping concentration profile as in memory cell areas of the strips of the first semiconductor material, because the ion implantation is blocked or shadowed on the material due to shadowing of layers above the layer. A stairstep landing area (e.g. 814) is formed on the layer between the conductive lines (e.g. 844, 854), and has a third doping concentration profile resulting from the ion implantation. An interlayer connector (e.g. 804) is formed on the stairstep landing area. Stairstep landing areas on layers below the layer (e.g. 815-818) are formed in an opening between conductive lines 844 and 854 on the layer (e.g. 934) and adjacent the stairstep landing area on the layer (e.g. 814).

FIG. 9C shows the pad region on the bottom layer. The first semiconductor material (e.g. 998) as deposited remains between conductive lines (e.g. 848, 858), and may have the same doping concentration profile as in memory cell areas of the strips of the first semiconductor material, because the ion implantation is blocked or shadowed on the material due to shadowing of layers above the bottom layer. A stairstep landing area (e.g. 818) is formed on the bottom layer between the conductive lines (e.g. 848, 858). An interlayer connector (e.g. 808) is formed on the stairstep landing area.

Figure 10:
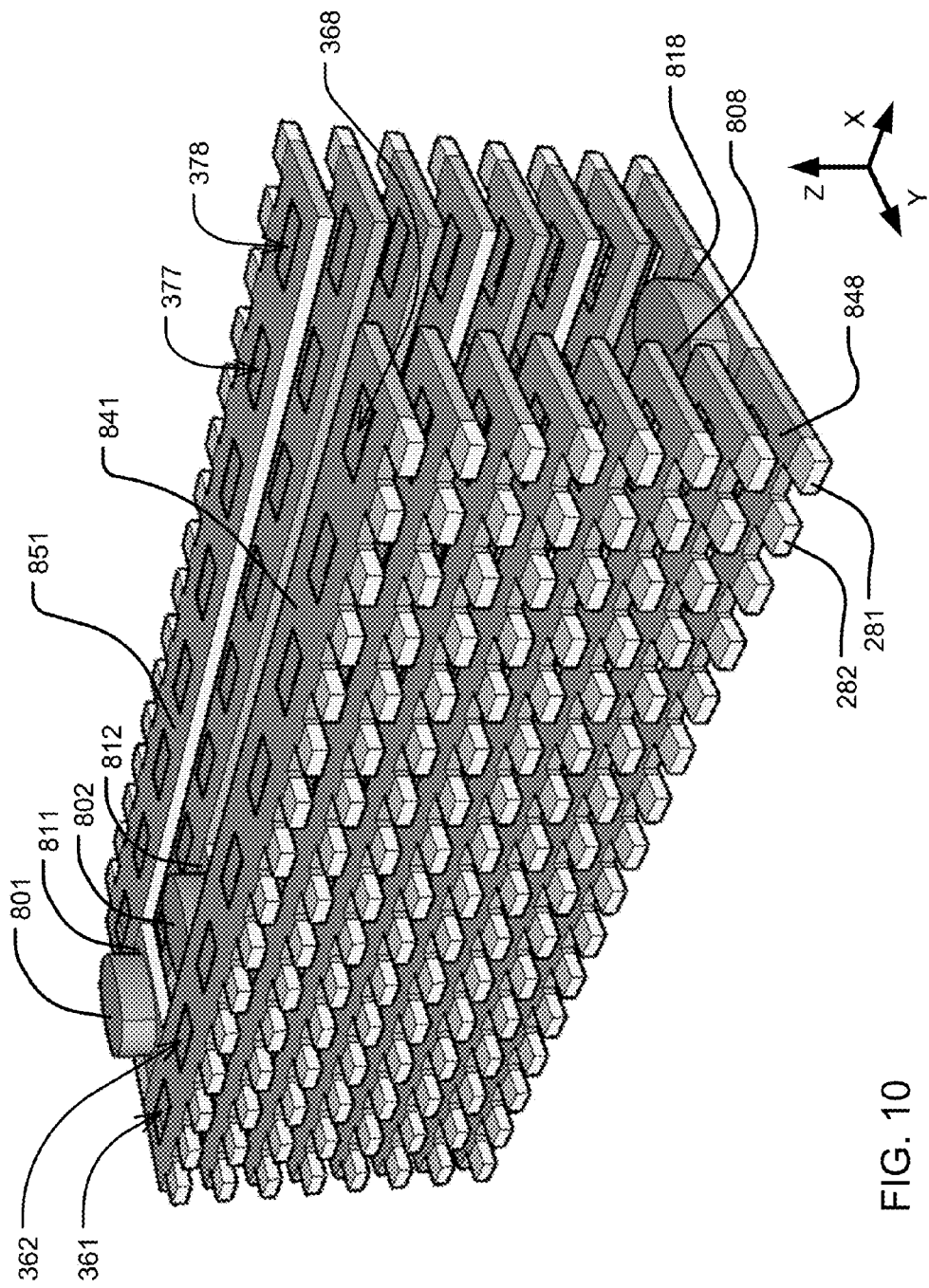
FIG. 10 is an isometric view of pad regions in a memory device.

FIG. 10 is an isometric view of pad regions in a memory device. As shown in the example of FIG. 10, the device includes a plurality of layers, where layers in the plurality include respective semiconductor pads of a first semiconductor material. The layers are disposed so that the semiconductor pads in the plurality of layers form a stack of semiconductor pads. The device includes a stack of layers of second semiconductor material (e.g. 841, 851) in contact with the first semiconductor material in the stacks of semiconductor pads. A plurality of pillars of insulating material (e.g. 361, 362, 368, 377, 378) is disposed through the stack of layers of second semiconductor material, where the second semiconductor material is in regions adjacent and surrounding the pillars of insulating material in the layers.

Stairstep landing areas (e.g. 811, 812 and 818) in the stack of semiconductor pads can have third doping concentration profiles, for example resulting from the ion implantation. Elements of the second semiconductor material in the stack of layers (e.g. 841, 851) have second doping concentration profiles, where the second doping concentration profiles establish a higher conductivity in the elements of the second semiconductor material. The plurality of pillars of insulating material includes at least a set of pillars arranged in a line (e.g. 361, 362 and 368). The elements of the second semiconductor material (e.g. 841) in regions adjacent and surrounding pillars in the set of pillars connect between adjacent pillars in the line to form a conductive line.

Layers on the plurality of layers include respective pluralities of strips (e.g. 281, 282) coupled to the semiconductor pads (e.g. 848). The pluralities of strips can have a first doping concentration profile. A memory layer can be disposed on surfaces of strips in the pluralities of strips. Interlayer connectors (e.g. 801, 802 and 808) are disposed on respective stairstep landing areas (e.g. 811, 812 and 818) in the stack of semiconductor pads.

In one implementation of a vertical gate 3-D array such as described in connection with FIG. 10, a stack of semiconductor pads of a first semiconductor material is coupled to strips in a plurality of stacks of strips, where the strips act as bit lines and the semiconductor pads act as bit line pads. In one implementation of a vertical channel 3-D array such as described in U.S. Non-Provisional patent application Ser. No. 14/284,306, a stack of semiconductor pads of a first semiconductor material substantially as described can be coupled to strips in a plurality of stacks of strips, where the strips act as word lines and the semiconductor pads act as word line pads. In other implementations, a stack of semiconductor pads of a first semiconductor material substantially as described herein can be applied in other multilayer circuit structures.

Figure 11:
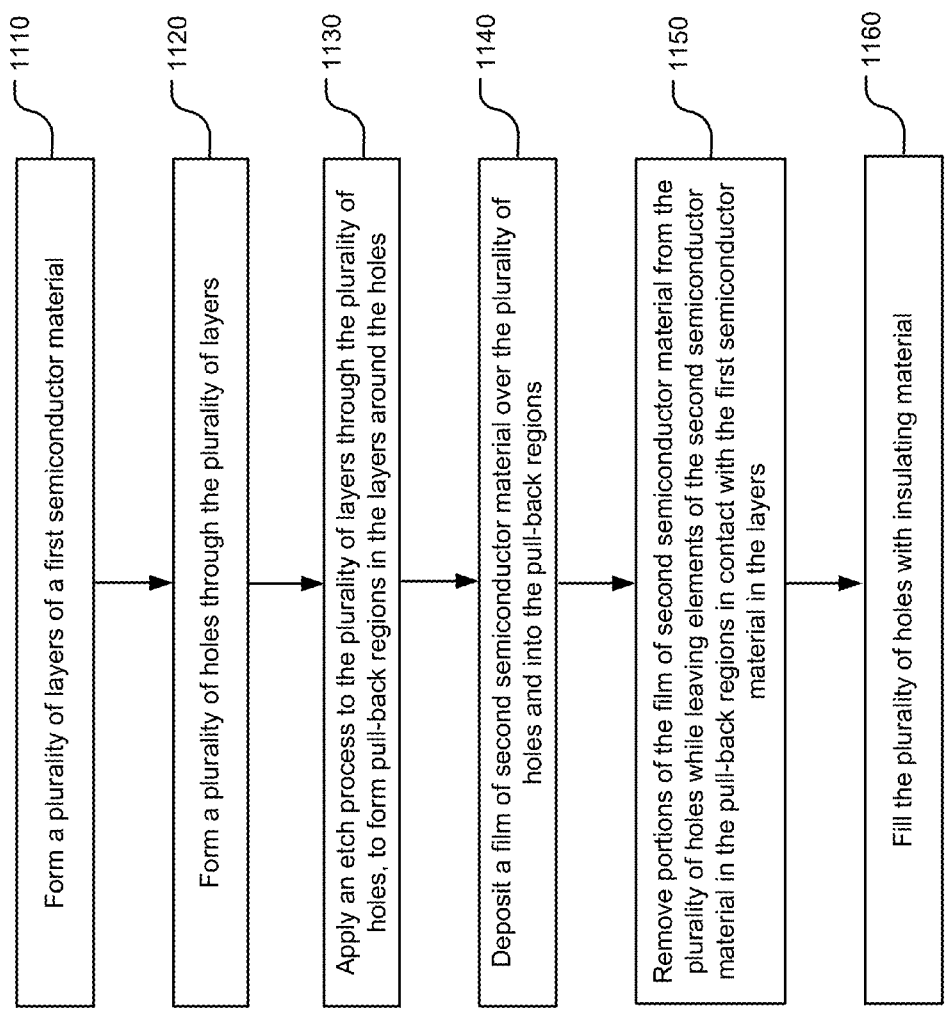
FIG. 11 illustrates a simplified flowchart of an embodiment of a method for manufacturing a memory device.

FIG. 11 illustrates a simplified flowchart of an embodiment of a method for manufacturing a memory device. At Step 1110, a plurality of layers of a first semiconductor material alternating with insulating material is formed on a semiconductor substrate. At Step 1120, a plurality of holes is formed through the plurality of layers. The plurality of holes can include at least a set of holes arranged in a line. At Step 1130, an etch process is applied to the plurality of layers through the plurality of holes, to form pull-back regions in the layers adjacent and surrounding the holes. At Step 1140, a film of the second semiconductor material is deposited over the plurality of holes and into the pull-back regions. At Step 1150, portions of the film of the second semiconductor material are removed from the plurality of holes while leaving elements of the second semiconductor material in the pull-back regions in contact with the first semiconductor material in the layers. Layers in the plurality of layers of first semiconductor material have respective first doping concentration profiles, and the elements of the second semiconductor material in the pull-back regions have second doping concentration profiles, where the second doping concentration profiles establish a higher conductivity in the elements of the second semiconductor material. The elements of the second semiconductor material in the pull-back regions adjacent holes in the set of holes can connect between adjacent holes in the line to form a conductive line. At Step 1160, the plurality of holes is filled with insulating material, such that a plurality of pillars of insulating material is formed through the stack of layers of second semiconductor material, where the second semiconductor material is in regions adjacent and surrounding the pillars in the layers.

After the plurality of layers of a first semiconductor material is formed and before the plurality of holes is formed through the plurality of layers, a plurality of stacks of strips of first semiconductor material can be etched in the plurality of layers of first semiconductor material, a memory layer can be formed on surfaces of strips in the plurality of stacks, and a plurality of conductive lines can be formed over the memory layer. The conductive lines can act as word lines for forming memory cells on the stacks of strips, and ground select lines and string select lines for operating memory cells.

Figure 12:
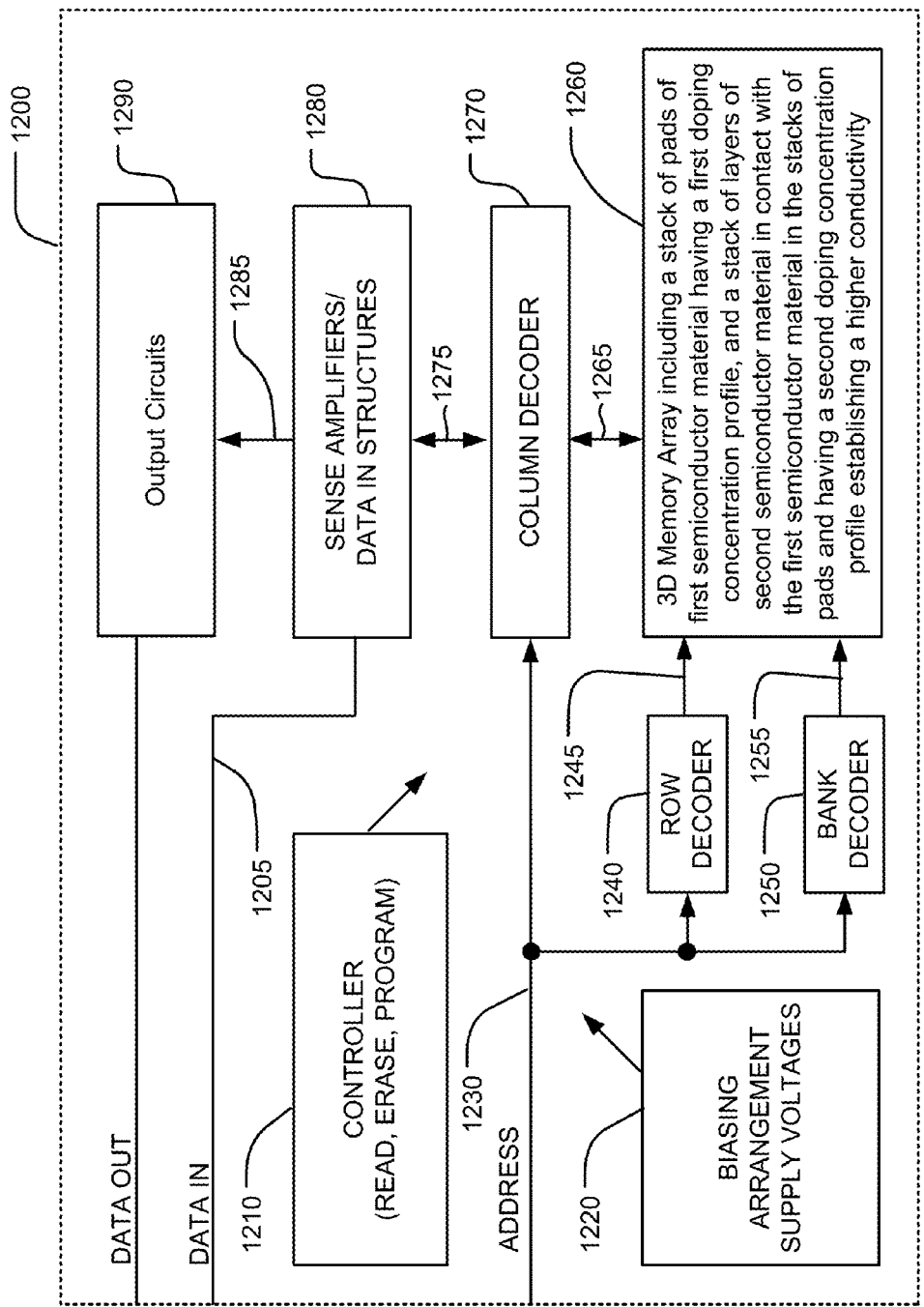
FIG. 12 is a simplified block diagram of an integrated circuit memory device according to an embodiment.

FIG. 12 is a simplified block diagram of an integrated circuit memory device according to an embodiment. The integrated circuit 1200 includes a 3D memory array 1260 on an integrated circuit substrate.

The 3D memory array 1260 includes a plurality of layers, where layers in the plurality include respective semiconductor pads of a first semiconductor material, and are disposed so that the semiconductor pads in the plurality of layers form a stack of semiconductor pads. The 3D memory array 1260 includes a stack of layers of second semiconductor material in contact with the first semiconductor material in the stacks of semiconductor pads. A plurality of pillars of insulating material is disposed through the stack of layers of second semiconductor material, where the second semiconductor material is in regions adjacent and surrounding the pillars of insulating material in the layers. Pads in the stack of semiconductor pads of first semiconductor material have respective first doping concentration profiles, and elements of the second semiconductor material in the stack of layers have second doping concentration profiles, where the second doping concentration profiles establish a higher conductivity in the elements of the second semiconductor material.

The plurality of pillars can include at least a set of pillars arranged in a line, and the elements of the second semiconductor material in regions adjacent and surrounding adjacent pillars in the set of pillars can connect between adjacent pillars in the line to form a conductive line. The first and second semiconductor materials can be silicon with different doping concentration profiles.

Layers on the plurality of layers can include respective pluralities of strips coupled to the semiconductor pads. A memory layer can be disposed on surfaces of strips in the pluralities of strips. The plurality of pillars can include at least a set of pillars arranged in a line, and the elements of the second semiconductor material in regions adjacent and surrounding adjacent pillars in the set of pillars can connect between adjacent pillars in the line to form a conductive line of second semiconductor material. The memory device can include openings for a plurality of stairstep landing areas on semiconductor pads in the stacks of semiconductor pads, and ion implantation regions in the stairstep landing areas in the semiconductor pads adjacent the openings.

In a layer of pads in the stack of semiconductor pads, pads of first semiconductor material can have a first doping concentration profile, the conductive line of second semiconductor material can have a second doping concentration profile, and the stairstep landing area can have a third doping concentration profile.

A row decoder 1240 is coupled to a plurality of word lines 1245, and arranged along rows in the memory array 1260. A column decoder 1270 is coupled to a plurality of bit lines 1265 arranged along columns in the memory array 1260 for reading and programming data from the memory cells in the memory array 1260. A bank decoder 1250 is coupled to a plurality of banks in the memory array 1260 on bus 1255. Addresses are supplied on bus 1230 to column decoder 1270, row decoder 1240 and bank decoder 1250. Sense amplifiers and data-in structures in block 1280 are coupled to the column decoder 1270, in this example via data bus 1275. Sensed data from the sense amplifiers are supplied via output data lines 1285 to output circuits 1290. Output circuits 1290 drive the sensed data to destinations external to the integrated circuit 1200. Input data is supplied via the data-in line 1205 from input/output ports on the integrated circuit 1200 or from other data sources internal or external to the integrated circuit 1200, such as a general purpose processor or special purpose application circuitry, or a combination of modules providing system-on-a-chip functionality supported by the 3D memory array 1260, to the data-in structures in block 1280.

In the example shown in FIG. 12, a controller 1210 using a bias arrangement state machine controls the application of bias arrangement supply voltage generated or provided through the voltage supply or supplies in block 1220, such as read and program voltages. The controller 1210 can include modes of operation for multi-level cell (MLC) programming and reading. The controller 1210 can be implemented using special-purpose logic circuitry as known in the art. In alternative embodiments, the controller comprises a general-purpose processor, which can be implemented on the same integrated circuit, which executes a computer program to control the operations of the device. In yet other embodiments, a combination of special-purpose logic circuitry and a general-purpose processor can be utilized for implementation of the controller.

The technology described herein can be applied to three-dimensional, multi-layer memory devices, including floating gate memory, charge trapping memory and other non-volatile memory. The technology can also be applied to other semiconductor devices that can benefit from improved formation of high concentration junctions in multi-layer structures, where the junction formation is performed after high thermal processes.

While the present technology is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the technology and the scope of the following claims.

What is claimed is:

1. A method for manufacturing a memory device, comprising:
    forming a plurality of layers of a first semiconductor material;
    forming a plurality of holes through the plurality of layers;

applying an etch process to the plurality of layers through the plurality of holes, to form pull-back regions in the layers adjacent and surrounding the holes;

depositing a film of a second semiconductor material over the plurality of holes and into the pull-back regions;

removing portions of the film of the second semiconductor material from the plurality of holes while leaving elements of the second semiconductor material in the pull-back regions in contact with the first semiconductor material in the layers; and filling the plurality of holes with insulating material, wherein layers in the plurality of layers of the first semiconductor material have respective first doping concentration profiles, and the elements of the second semiconductor material in the pull-back regions have second doping concentration profiles, the second doping concentration profiles establishing a conductivity in the elements of the second semiconductor material higher than that established by the first doping concentration profiles in the corresponding layers of first semiconductor material.

2. The method of claim 1, wherein the plurality of holes includes at least a set of holes arranged in a line, and the elements of the second semiconductor material in the pull-back regions adjacent holes in the set of holes connect between adjacent holes in the line to form a conductive line.

3. The method of claim 1, including forming openings for a plurality of stairstep landing areas on the plurality of layers, and performing ion implantation through the openings in the plurality of layers.

4. The method of claim 1, wherein the first and second semiconductor materials are silicon with different doping concentration profiles.

5. The method of claim 1, wherein the layers of the first semiconductor material are patterned, and include pad regions and respective pluralities of strips coupled to the pad regions, and wherein the plurality of holes is formed through the pad regions.

6. The method of claim 5, wherein the plurality of holes includes at least a set of holes arranged in a line, and the elements of the second semiconductor material in the pull-back regions adjacent holes in the set of holes connect between adjacent holes in the line to form a conductive line of second semiconductor material.

7. The method of claim 6, including forming openings for a plurality of stairstep landing areas in the pad regions on the plurality of layers, and performing ion implantation in the stairstep landing areas in the pad regions adjacent the openings.

8. The method of claim 7, wherein in a layer in the plurality of layers, the pad region of the first semiconductor material has a first doping concentration profile, the conductive line of second semiconductor material has a second doping concentration profile, and the stairstep landing area has a third doping concentration profile.

9. The method of claim 1, including:
after said forming the plurality of layers of a first semiconductor material and before said forming the plurality of holes through the plurality of layers,
etching a plurality of stacks of strips of first semiconductor material in the plurality of layers of the first semiconductor material;
forming a memory layer on surfaces of strips in the plurality of stacks; and
forming a plurality of conductive lines over the memory layer.

10. A device, comprising:
a plurality of layers, layers in the plurality including respective semiconductor pads of a first semiconductor material, the layers being disposed so that the semiconductor pads in the plurality of layers form a stack of semiconductor pads;
a stack of layers of second semiconductor material in contact with the first semiconductor material in the stacks of semiconductor pads; and
a plurality of pillars of insulating material through the stack of layers of second semiconductor material, wherein the second semiconductor material is in regions adjacent and surrounding the pillars of insulating material in the layers,
wherein pads in the stack of semiconductor pads of the first semiconductor material have respective first doping concentration profiles, and elements of the second semiconductor material in the stack of layers have second doping concentration profiles, the second doping concentration profiles establishing a conductivity in the elements of the second semiconductor material higher than that established by the first doping concentration profiles in the corresponding layers of first semiconductor material.

11. The device of claim 10, wherein the plurality of pillars includes at least a set of pillars arranged in a line, and the elements of the second semiconductor material in regions adjacent and surrounding adjacent pillars in the set of pillars connect between adjacent pillars in the line to form a conductive line.

12. The device of claim 10, including openings for a plurality of stairstep landing areas on the plurality of layers, and ion implantation through the openings in the plurality of layers.

13. The device of claim 10, wherein the first and second semiconductor materials are silicon with different doping concentration profiles.

14. The device of claim 10, wherein layers on the plurality of layers include respective pluralities of strips coupled to the semiconductor pads.

15. The device of claim 14, including a memory layer on surfaces of strips in the pluralities of strips.

16. The device of claim 14, wherein the plurality of pillars includes at least a set of pillars arranged in a line, and elements of the second semiconductor material having second doping concentration profiles in regions adjacent and surrounding adjacent pillars in the set of pillars connect between adjacent pillars in the line to form a conductive line of second semiconductor material.

17. The device of claim 16, including openings for a plurality of stairstep landing areas on semiconductor pads in the stacks of semiconductor pads, and ion implantation regions in the stairstep landing areas in the semiconductor pads adjacent the openings.

18. The device of claim 17, wherein in a layer of pads in the stack of semiconductor pads, pads of first semiconductor material have a first doping concentration profile, the conductive line of second semiconductor material has a second doping concentration profile, and the stairstep landing area has a third doping concentration profile.

* * * * *